United States Patent
Chang et al.

(10) Patent No.: US 6,805,952 B2
(45) Date of Patent: Oct. 19, 2004

(54) LOW CONTAMINATION PLASMA CHAMBER COMPONENTS AND METHODS FOR MAKING THE SAME

(75) Inventors: Christopher C. Chang, Sunnyvale, CA (US); Robert J. Steger, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 130 days.

(21) Appl. No.: 09/749,917

(22) Filed: Dec. 29, 2000

(65) Prior Publication Data

US 2002/0086118 A1 Jul. 4, 2002

(51) Int. Cl.[7] .......................... B32B 3/00; B32B 15/04; B32B 15/08; H01L 21/02; C23C 16/02
(52) U.S. Cl. ...................... 428/334; 428/335; 428/457; 428/469; 428/473.5; 438/9; 216/67; 118/723 R
(58) Field of Search ................................ 428/334, 335, 428/457, 458, 469, 473.5, 480, 6.88; 427/487–489; 438/9; 216/67; 118/723 R; 523/351; 524/412

(56) References Cited

U.S. PATENT DOCUMENTS

| | | |
|---|---|---|
| 4,340,462 A | 7/1982 | Koch |
| 4,948,458 A | 8/1990 | Ogle |
| 5,198,718 A | 3/1993 | Davis et al. |
| 5,200,232 A | 4/1993 | Tappan et al. |
| 5,241,245 A | 8/1993 | Barnes et al. |
| 5,302,420 A * | 4/1994 | Nguyen et al. ............. 427/490 |
| 5,304,279 A | 4/1994 | Coultas et al. |
| 5,366,585 A | 11/1994 | Robertson et al. |
| 5,391,275 A | 2/1995 | Mintz |
| 5,401,319 A | 3/1995 | Banholzer et al. |
| 5,401,350 A | 3/1995 | Patrick et al. |
| 5,464,476 A | 11/1995 | Gibb et al. |
| 5,474,649 A | 12/1995 | Kava et al. |
| 5,486,235 A | 1/1996 | Ye et al. |
| 5,525,159 A | 6/1996 | Hama et al. |
| 5,529,657 A | 6/1996 | Ishii |
| 5,531,834 A | 7/1996 | Ishizuka et al. |
| 5,560,780 A | 10/1996 | Wu et al. |
| 5,580,385 A | 12/1996 | Paranjpe et al. |
| 5,676,759 A | 10/1997 | Ye et al. |
| 5,685,916 A | 11/1997 | Ye et al. |
| 5,820,723 A | 10/1998 | Benjamin et al. |
| 5,824,605 A | 10/1998 | Chen et al. |
| 5,851,343 A | 12/1998 | Hsu et al. |
| 5,863,376 A | 1/1999 | Wicker et al. |
| 5,879,523 A | 3/1999 | Wang et al. |
| 5,916,454 A | 6/1999 | Richardson et al. |
| 5,993,594 A | 11/1999 | Wicker et al. |
| 6,048,798 A | 4/2000 | Gadgil et al. |
| 6,120,640 A | 9/2000 | Shih et al. |

FOREIGN PATENT DOCUMENTS

| | | |
|---|---|---|
| EP | 0253754 A1 | 1/1988 |
| EP | 0546802 A2 | 6/1993 |
| EP | 0845545 A1 | 6/1998 |
| WO | WO99/20812 | 4/1999 |

OTHER PUBLICATIONS

Notification of Transmittal of the International Search Report or the Declaration for PCT/US01/47571.
Written Opinion for PCT/US01/47571 dated Oct. 4, 2002.

* cited by examiner

Primary Examiner—Paul Thibodeau
(74) Attorney, Agent, or Firm—Burns, Doane, Swecker & Mathis, L.L.P.

(57) ABSTRACT

Components for use in plasma processing chambers having plasma exposed surfaces with surface roughness characteristics that promote polymer adhesion. The roughened surfaces are formed by plasma spraying a coating material such as a ceramic or high temperature polymer onto the surface of the component. The plasma sprayed components of the present invention can be used for plasma reactor components having surfaces exposed to the plasma during processing. Suitable components include chamber walls, chamber liners, baffle rings, gas distribution plates, plasma confinement rings, and liner supports. By improving polymer adhesion, the plasma sprayed component surfaces can reduce the levels of particle contamination in the process chamber thereby improving yields and reducing down-time required for cleaning and/or replacing chamber components.

21 Claims, 4 Drawing Sheets

LOW CONTAMINATION PLASMA CHAMBER COMPONENTS AND METHODS FOR MAKING THE SAME

BACKGROUND OF THE INVENTION

1. Field of the Invention

The present invention relates generally to the fabrication of semiconductor wafers, and, more particularly, to plasma etching chambers having components that reduce particle contamination during processing.

2. Description of the Related Art

In the field of semiconductor processing, vacuum processing chambers are generally used for etching and chemical vapor depositing (CVD) of materials on substrates by supplying an etching or deposition gas to the vacuum chamber and application of an RF field to the gas to energize the gas into a plasma state. Examples of parallel plate, transformer coupled plasma (TCP™) which is also called inductively coupled plasma (ICP), and electron-cyclotron resonance (ECR) reactors and components thereof are disclosed in commonly owned U.S. Pat. Nos. 4,340,462; 4,948,458; 5,200,232 and 5,820,723.

In semiconductor integrated circuit fabrication, devices such as component transistors may be formed on a semiconductor wafer or substrate, which is typically made of silicon. Metallic interconnect lines, which are typically etched from a metallization layer disposed above the wafer, may then be employed to couple the devices together to form the desired circuit. The metallization layers typically comprise copper, aluminum or one of the known aluminum alloys such as Al—Cu, Al—Si or Al—Cu—Si. An anti-reflective coating (ARC) layer and an overlying photoresist (PR) layer, may be formed on top of the metallization layer. The ARC layer typically comprises a titanium containing layer such as TiN or TiW. To form the aforementioned metallic interconnect lines, a portion of the layers of the layer stack, including the metallization layer, can be etched using a suitable photoresist technique. The areas of the metallization layer that are unprotected by the mask may then be etched away using an appropriate etching source gas, leaving behind metallization interconnect lines or features.

To achieve greater circuit density, modern integrated circuits are scaled with increasingly narrower design rules. As a result, the feature sizes, i.e., the width of the interconnect lines or the spacings (e.g., trenches) between adjacent interconnect lines, have steadily decreased. To form the narrow conductor lines of modern integrated circuits, highly anisotropic etching is desired. Etch anisotropy refers to the rate of vertical etching compared to the rate of lateral etching. In order to form high aspect ratio features with vertical sidewalls, the rate of vertical etching must be significantly greater than the rate of lateral etching. In plasma etching, vertical profiles are often achieved using sidewall passivation techniques. Such techniques typically involve introducing a polymer forming species (usually fluorocarbons such as $CF_4$, $CHF_3$, $C_4F_8$) into the reaction chamber during etching. The polymer which forms during etching is preferentially deposited on the sidewalls of the etched features thereby reducing lateral etching of the substrate and increasing etch anisotropy. During the etching process, however, polymer deposits can also form on the interior surfaces of various components of the etch chamber which are exposed to the plasma. Over time, these polymer deposits can flake or peel off thus becoming a source of particle contamination in the plasma reactor.

The polymer deposits formed inside the plasma reactor typically comprise chain molecules of carbon compounds. When the polymer contacts and adheres to the substrate being processed, it can contaminate that portion of the substrate and reduces the die yield therefrom. Polymer deposits can accumulate on all chamber surfaces, particularly on the surfaces of the chamber housing adjacent the process gas inlet tubes, as well as the underside of the chamber cover or gas distribution plate opposite the substrate surface. The polymer deposited on the interior surfaces of the chamber can migrate onto the substrate to create a substrate defect. Polymer particulate contamination is exacerbated by the thermal cycling of the reactor components during repeated plasma processing cycles. The repeated heating and cooling of the plasma exposed surfaces of reactor components can cause the adhered polymer deposits to exfoliate or flake off due to CTE differentials between the polymer deposits and the reactor surfaces. The polymer deposits can also become dislodged by bombardment with reactant species in the plasma.

As integrated circuit devices continue to shrink in both their physical size and their operating voltages, their associated manufacturing yields become more susceptible to particle contamination. Consequently, fabricating integrated circuit devices having smaller physical sizes requires that the level of particulate contamination be less than previously considered to be acceptable. Various methods have been employed to reduce particle contamination in plasma reactors. See, for example, U.S. Pat. Nos. 5,366,585; 5,391,275; 5,401,319; 5,474,649; 5,851,343; 5,916,454; 5,993,594; 6,120,640; and 6,155,203.

In order to reduce particle contamination, plasma reactors can be periodically cleaned to remove the polymer deposits. Plasma cleaning processes are disclosed in U.S. Pat. Nos. 5,486,235; 5,676,759; and 5,685,916. Additionally, the plasma reactor parts are typically replaced periodically with new reactor parts.

It would be desirable to provide plasma reactor components that reduce the levels of particle contamination inside the reactor chamber. The use of such parts would help to improve the yield and/or increase the period of time between cleaning or replacement of plasma reactor components.

SUMMARY OF THE INVENTION

The present inventors have discovered that particle contamination in plasma reactors can be reduced by plasma spraying a coating material such as a ceramic or high temperature polymer onto plasma exposed surfaces of the reactor. The plasma sprayed material forms a coating having desired surface roughness characteristics to promote adhesion of polymer deposits. The improved adhesion of the polymer deposits on chamber surfaces can reduce the tendency of the deposits to flake or peel off of the chamber surfaces thereby reducing the level of particulate contamination in the reactor. By improving the adhesion of polymer deposits on plasma reactor components, reactor components may need to be cleaned or replaced less frequently thereby reducing the cost of operating the plasma reactor.

According to one embodiment of the present invention, a method of making a plasma reactor component is provided. The reactor component has one or more surfaces which are exposed to plasma during use. The method includes plasma spraying a coating material onto a plasma exposed surface of the component to form a coating having surface roughness characteristics that promote the adhesion of polymer deposits.

According to another embodiment of the present invention, a component of a plasma reactor having one or more surfaces exposed to the plasma during processing is provided. The component includes a plasma sprayed coating on a plasma exposed surface thereof. The coating has surface roughness characteristics that promote the adhesion of polymer deposits.

According to another embodiment of the present invention, a plasma reactor including one or more components as set forth above and a method of processing a substrate therein are also provided. The method includes contacting an exposed surface of the substrate with a plasma.

BRIEF DESCRIPTION OF THE DRAWINGS

The invention will be described in greater detail with reference to accompanying drawings in which like elements bear like reference numerals, and wherein.

DETAILED DESCRIPTION OF THE PREFERRED EMBODIMENTS

The invention provides improvements in reducing particle contamination of substrates such as semiconductor (e.g., silicon, gallium arsenide, etc.) wafers, flat panel display substrates, and the like. In particular, the present invention provides components for use in plasma processing chambers having plasma exposed surfaces with surface roughness characteristics that promote polymer adhesion. The roughened surfaces are formed by plasma spraying a coating material such as a ceramic or polymeric material onto the surface. The plasma sprayed components of the present invention can be used for any plasma reactor component that is exposed to plasma during processing. Suitable components include, for example, chamber liners, baffle rings, gas distribution plates, focus rings, plasma confinement rings, pedestals, and liner supports.

The reactor components of the present invention can be made from metallic materials or ceramic materials. Suitable metallic materials include aluminum. The aluminum surfaces to be plasma spray coated can be bare (except for a native oxide layer) or anodized. Alternatively, the reactor components can be made from ceramic materials such as alumina, silica, quartz, titania, zirconia, yttria, titanium carbide, zirconium carbide, silicon carbide, boron carbide, aluminum nitride, titanium nitride, silicon nitride, and/or boron nitride. The ceramic components can be made by any conventional ceramic manufacturing technique such as hot pressing and sintering ceramic powders into bulk parts.

In the present invention, any or all of the surfaces of the reactor components which are exposed to the plasma during processing can be coated with a plasma sprayed material such as a ceramic or high temperature polymer. The plasma sprayed coating according to the present invention provides interior surfaces of the reactor with surface roughness characteristics that promote the adhesion of polymer deposits formed in the plasma chamber during etching. In the present invention, the inventive coatings preferably have surface roughness values (Ra) suitable for achieving improved adhesion of polymer byproducts produced during processing of substrates in the plasma reactor. For example, the arithmetic mean surface roughness (Ra) of the plasma sprayed surfaces according to the present invention can range from 150 to 190 micro-inches. Surface roughness values in this range promote the adhesion of polymer deposited on interior surfaces of the reaction chamber during a plasma etch process such as a metal etch.

Figure 1:
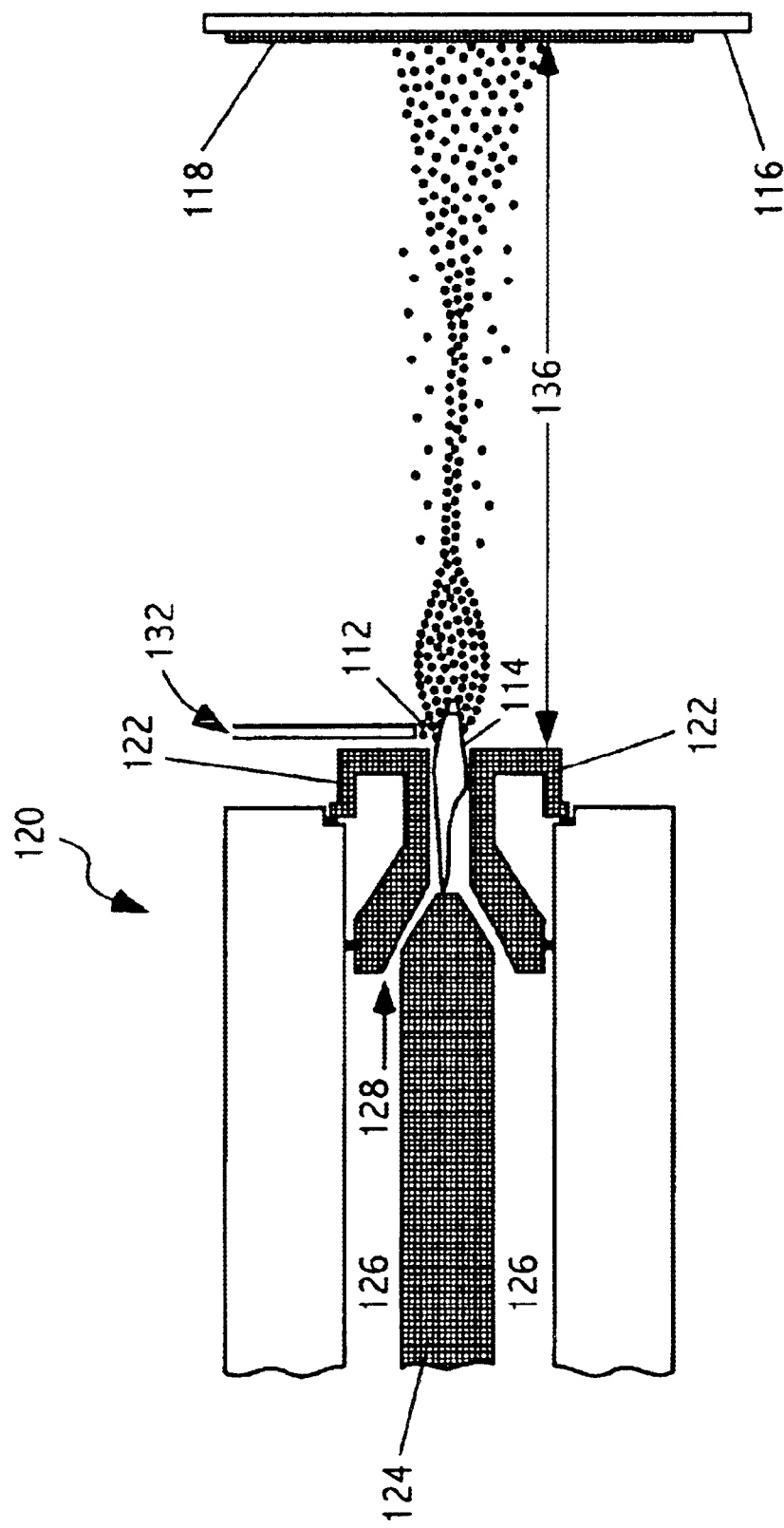
FIG. 1 illustrates a conventional plasma spray process.

The plasma spraying process typically involves spraying a molten or heat softened material onto a surface. FIG. 1 illustrates a typical plasma spraying process. The coating material, usually in the form of a powder 112, is injected into a high temperature plasma flame 114 where it is rapidly heated and accelerated to a high velocity. The hot material impacts on the substrate surface 116 and rapidly cools to form a coating 118.

The plasma spray gun 120 typically comprises an anode 122 (usually made of copper) and a cathode 124 (usually made of tungsten), both of which can be water cooled. Plasma gas 126 (e.g., argon, nitrogen, hydrogen, helium, etc.) flows around the cathode in the direction generally indicated by arrow 128 and through the anode 122 which is shaped as a constricting nozzle. The plasma is initiated by a high voltage discharge which causes localized ionization and a conductive path for a DC arc to form between the cathode 124 and the anode 122. Resistance heating from the arc causes the gas to reach extreme temperatures, dissociate and ionize to form a plasma. The plasma exits the anode 122 as a free or neutral plasma flame (plasma which does not carry electric current). When the plasma is stabilized and ready for spraying, the electric arc extends down the nozzle. Powder 112 is fed into the plasma flame usually via an external powder port 132 mounted near the anode nozzle exit 134. The powder 112 is rapidly heated and accelerated such that the powder particles 112 in a molten or heat-softened state are caused to impact on substrate 116.

Various bonding mechanisms may be present at the coating/substrate interface and between the particles making up the plasma sprayed coating. Generally, both mechanical interlocking and diffusion bonding occur. Bonding mechanisms that may be present include: mechanical keying or interlocking; diffusion bonding; and other adhesive, chemical and physical bonding mechanisms (e.g., Van der Waals forces). Factors effecting bonding and subsequent build up of plasma sprayed coatings include: the cleanliness of the substrate surface; the surface area available for bonding; the surface topography or surface profile; the temperature (thermal energy) of the particles and substrate; the time (e.g., reaction rates and cooling rates etc.); the velocity (kinetic energy) of the powder particles; the physical and chemical properties of the substrate and the powder particles; and any physical and chemical reactions that may occur during the process.

In the present invention, surface preparation techniques such as cleaning and grit or bead blasting can be used to provide a more chemically and physically active component surface for bonding of the plasma sprayed coating. By grit or bead blasting, the surface area available for bonding can be increased which can result in increased coating bond strength. For alumina chamber components, the surfaces to be coated are preferably grit blasted with a contaminant free aluminum oxide media. The roughened surface can then be cleaned to remove loose particles by any suitable technique such as blasting the surface with air or $CO_2$ and/or washing the surface with an acid solution. The roughened surface profile of the substrate resulting from this treatment can help promote mechanical keying or interlocking of the coating with the substrate.

Once the plasma sprayed coating has been applied, the exposed surface of the coating can be cleaned using any suitable technique. Suitable cleaning techniques include blasting the surface with air or $CO_2$ and/or ultra-sonic cleaning. These cleaning steps can be repeated to achieve the desired level of surface cleanliness or conditioning of the component surface prior to using the component during plasma processing of substrates.

Plasma spraying has the advantage that it can spray very high melting point materials such as refractory metals and ceramics. Plasma sprayed coatings of ceramics, for example, have been employed as protective coatings for various plasma reactor components. See, for example, U.S. Pat. Nos. 5,560,780; 5,879,523; 5,993,594; and 6,120,640. Additionally, plasma spraying processes have also been developed for high melting point thermoplastic and thermosetting polymers such as polyimides.

In the present invention, the plasma sprayed coating can be any material that is resistant to erosion by the plasma. For example, any of the ceramic materials suitable for use as reactor components may also be used as coatings as long as these materials can be plasma sprayed. When the coating is a ceramic material, the coating is preferably the same material as the underlying component. By using the same material for the component and the coating, differences in the coefficients of thermal expansion (CTE) between the coating and component can be minimized or eliminated. These differences in CTE values can result in exfoliation of the coating material during thermal cycling of the reactor components during use. When the coating is alumina, the coating is preferably applied to the component at a thickness in the range of 2 to 5 mils (0.002 to 0.005 inches).

The coating may also be a polymeric material. When the coating is a polymer, the polymer should be capable of being plasma sprayed to form a tightly adherent coating on the component. A preferred high temperature polymer is a polyimide such as VESPEL®, which is a registered trademark of DuPont. Polyimide coatings are preferably applied to the component at a thickness of 10 to 30 mils (0.010 to 0.030 inches).

In plasma etching of substrates, features are etched into layers of various materials on substrates such as silicon wafers. Materials that are typically etched include metals and dielectric materials such as oxides (e.g., $SiO_2$). In such etching processes, a gas distribution plate can be used to control the spatial distribution of gas flow in the volume of the reactor above the plane of the substrate. Polymer build-up can be particularly problematic in plasma reactors wherein an antenna coupled to a radiofrequency (RF) source energizes gas into a plasma state within a process chamber. Plasma reactor of this type are disclosed in U.S. Pat. Nos. 4,948,458; 5,198,718; 5,241,245; 5,304,279; 5,401,350; 5,531,834; 5,464,476; 5,525,159; 5,529,657; and 5,580,385. In such systems, the antenna is separated from the interior of the process chamber by a dielectric member such as a dielectric window, gas distribution plate, encapsulating layer of epoxy, or the like, and the RF energy is supplied into the chamber through the dielectric member. Such processing systems can be used for a variety of semiconductor processing applications such as etching, deposition, resist stripping, etc.

During an oxide or metal etch of a semiconductor wafer in a plasma reactor of the aforementioned type, polymer deposits can build up on internal surfaces of the reactor including the exposed surface of the dielectric member or gas distribution plate facing the wafer. As the polymer build-up deepens, the polymer tends to flake or peel off of the dielectric member. When the dielectric member is located directly above the substrate and chuck, polymer particles can fall directly onto the substrate or the chuck below. These polymer particles can introduce defects into the substrate thus decreasing yields. Alternatively, the particles can migrate to the chuck surface causing chucking problems.

Typically, the etch process is stopped periodically and the interior chamber surfaces cleaned (e.g., using a dry etch treatment) to reduce the levels of particle contamination. Improper or incomplete cleaning, however, can actually increase the particle contaminant levels in the chamber. Further, the delay due to the "down-time" required for cleaning also represents a substantial loss in production yield. Therefore, control of the deposition of polymer on the interior surfaces of the etch chamber is desirable for achieving a high yield and maintaining through-put of the substrates in the plasma reactor.

Figure 2:
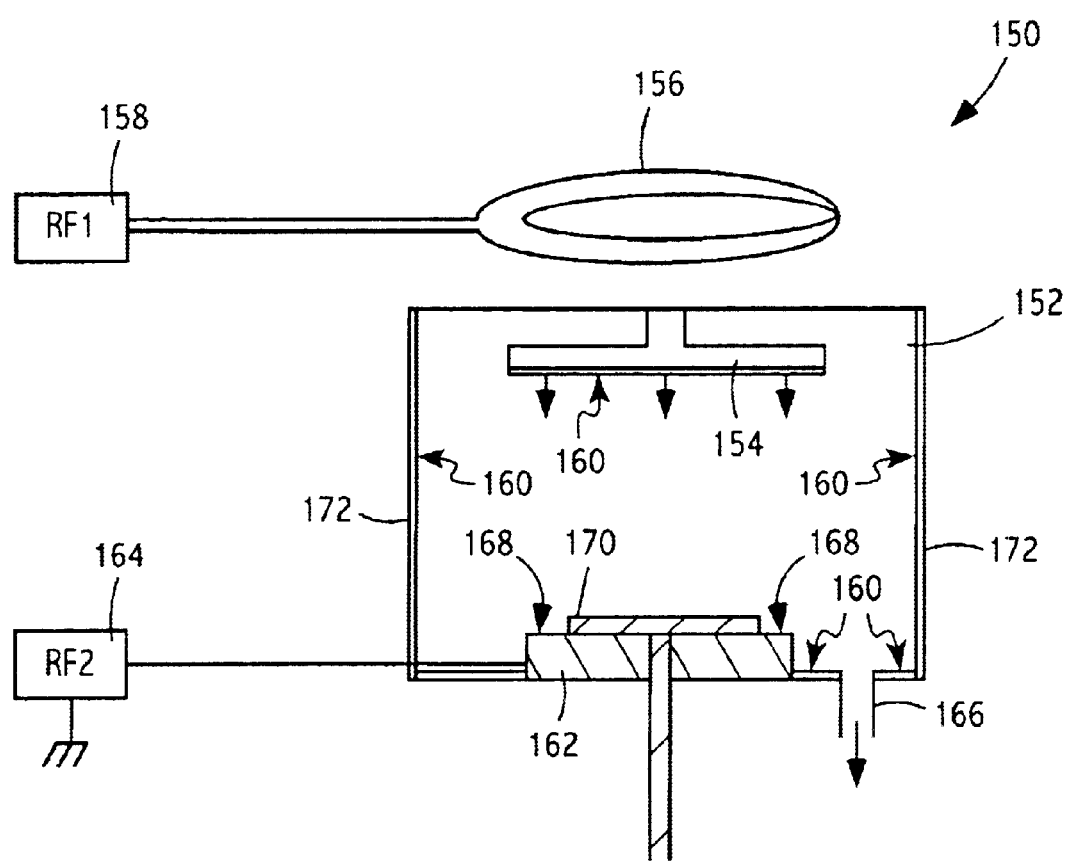
FIG. 2 shows a metal etch chamber incorporating plasma sprayed reactor components according to the present invention.

An exemplary metal etch reactor of the aforementioned type is a transformer coupled plasma reactor known as the TCP™ 9600 plasma reactor, which is available from Lam Research Corporation of Fremont, Calif. FIG. 2 illustrates a simplified schematic of the TCP™ 9600 plasma reactor. In FIG. 2, a reactor 150 including a plasma processing chamber 152 is shown. Above chamber 152, there is disposed an antenna 156 to generate plasma, which is implemented by a planar coil in the example of FIG. 2. The antenna 156 is typically energized by an RF generator 158 via a matching network (not shown). Within chamber 152, there is provided a showerhead 154, which preferably includes a plurality of holes for releasing gaseous source materials, e.g., the etchant source gases, into the RF-induced plasma region between the showerhead and wafer 170.

The gaseous source materials may also be released from ports built into the walls of chamber 152. Etchant source chemicals include, for example, halogens such as $Cl_2$ and $BCl_3$ when etching through aluminum or one of its alloys. Other etchant chemicals (e.g., $CH_4$, HBr, HCl, $CHCl_3$) as well as polymer forming species such as hydrocarbons, fluorocarbons, and hydro-fluorocarbons for sidewall passivation may also be used. These gases may be employed along with optional inert and/or nonreactive gases.

In use, a wafer 170 is introduced into chamber 152 defined by chamber walls 172 and disposed on a substrate support 162, which acts as a lower or second electrode. The wafer is preferably biased by a radio frequency generator 164 (also typically via a matching network). The wafer can comprise a plurality of integrated circuits (ICs) fabricated thereon. The ICs, for example, can include logic devices such as PLAs, FPGAs and ASICs or memory devices such as random access memories (RAMs), dynamic RAMs (DRAMs), synchronous DRAMs (SDRAMs), or read only memories (ROMs). When the RF power is applied, reactive species (formed from the etchant source gas) etch exposed surfaces of the wafer 170. The by-products, which may be volatile, are then exhausted through an exit port 166. After processing is complete, the wafer can be diced to separate the ICs into individual chips.

In the present invention, plasma exposed surfaces of a plasma confinement ring (not shown), chamber wall 172, a chamber liner (not shown) and/or showerhead 154 can be provided with a plasma sprayed coating 160 with surface roughness characteristics that promote polymer adhesion. In addition, plasma exposed surfaces of the substrate support 168 can also be provided with a plasma sprayed coating (not shown) according to the present invention. In this manner, substantially all surfaces that confine the high density plasma will have surface roughness characteristics that promote polymer adhesion. In this manner, particulate contamination inside the reactor can be substantially reduced.

The reactor components of the present invention can also be used in a high-density oxide etch process. An exemplary oxide etch reactor is the TCP 9100™ plasma etch reactor available from Lam Research Corporation of Fremont, Calif. In the TCP 9100™ reactor, the gas distribution plate is a circular plate situated directly below the TCP™ window which is also the vacuum sealing surface at the top of the reactor in a plane above and parallel to a semiconductor wafer. The gas distribution ring feeds gas from a source into the volume defined by the gas distribution plate. The gas distribution plate contains an array of holes of a specified diameter which extend through the plate. The spatial distribution of the holes through the gas distribution plate can be varied to optimize etch uniformity of the layers to be etched, e.g., a photoresist layer, a silicon dioxide layer and an underlayer material on the wafer. The cross-sectional shape of the gas distribution plate can be varied to manipulate the distribution of RF power into the plasma in the reactor. The gas distribution plate material is made from a dielectric material to enable coupling of this RF power through the gas distribution plate into the reactor. Further, it is desirable for the material of the gas distribution plate to be highly resistant to chemical sputter-etching in environments such as oxygen or a hydro-fluorocarbon gas plasma in order to avoid breakdown and the resultant particle generation associated therewith.

Figure 3:
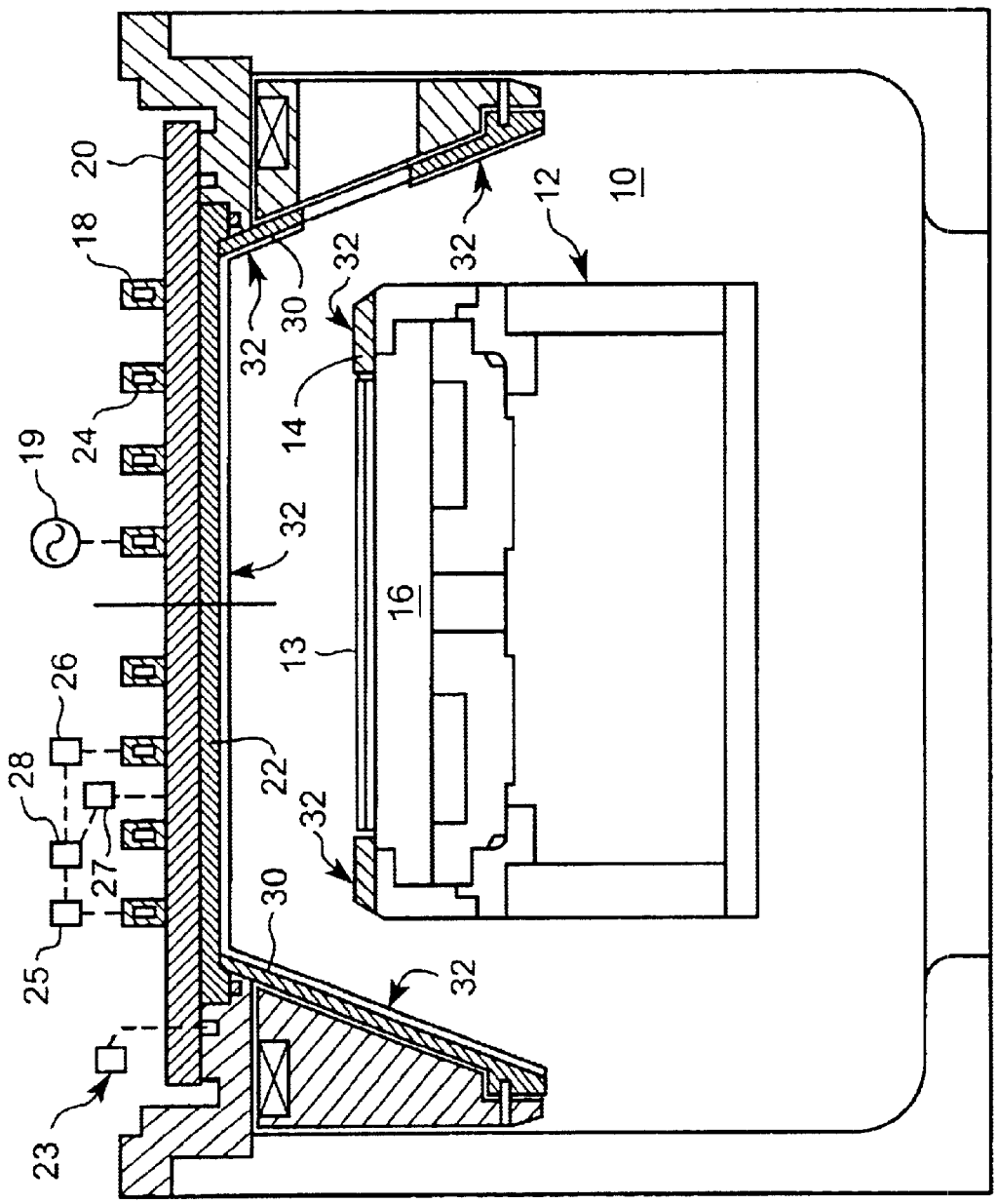
FIG. 3 shows a high density oxide etch chamber incorporating plasma sprayed reactor components according to the present invention.

A vacuum processing chamber for oxide etching according to one embodiment of the present invention is illustrated in FIG. 3. The vacuum processing chamber 10 includes a substrate holder 12 in the form of a bottom electrode providing an electrostatic clamping force to a substrate 13 as well as an RF bias to a substrate supported thereon and a focus ring 14 for confining plasma in an area above the substrate. The substrate may be back-cooled with a heat transfer gas such as helium. A source of energy for maintaining a high density (e.g. $10^{11}$–$10^{12}$ ions/cm$^3$) plasma in the chamber such as an antenna 18 in the form of a flat spiral coil powered by a suitable RF source and suitable RF impedance matching circuitry inductively couples RF energy into the chamber 10 so as to provide a high density plasma. The chamber includes suitable vacuum pumping apparatus for maintaining the interior of the chamber at a desired pressure (e.g. below 50 mTorr, typically 1–20 mTorr). A substantially planar dielectric window 20 of uniform thickness is provided between the antenna 18 and the interior of the processing chamber 10 and forms the vacuum wall at the top of the processing chamber 10. A gas distribution plate, commonly called a showerhead 22, is provided beneath the window 20 and includes a plurality of openings such as circular holes (not shown) for delivering process gas supplied by the gas supply 23 to the processing chamber 10. A conical liner 30 extends from the gas distribution plate and surrounds the substrate holder 12. The antenna 18 can be provided with a channel 24 through which a temperature control fluid is passed via inlet and outlet conduits 25, 26. However, the antenna 18 and/or window 20 could be cooled by other techniques such as by blowing air over the antenna and window, passing a cooling medium through or in heat transfer contact with the window and/or gas distribution plate, etc.

In operation, a wafer is positioned on the substrate holder 12 and is typically held in place by an electrostatic clamp, a mechanical clamp, or other clamping mechanism. Process gas is then supplied to the vacuum processing chamber 10 by passing the process gas through a gap between the window 20 and the gas distribution plate 22. Suitable gas distribution plate arrangements (i.e., showerhead) arrangements are disclosed in commonly owned U.S. Pat. Nos. 5,824,605; 5,863,376; and 6,048,798.

Figure 4:
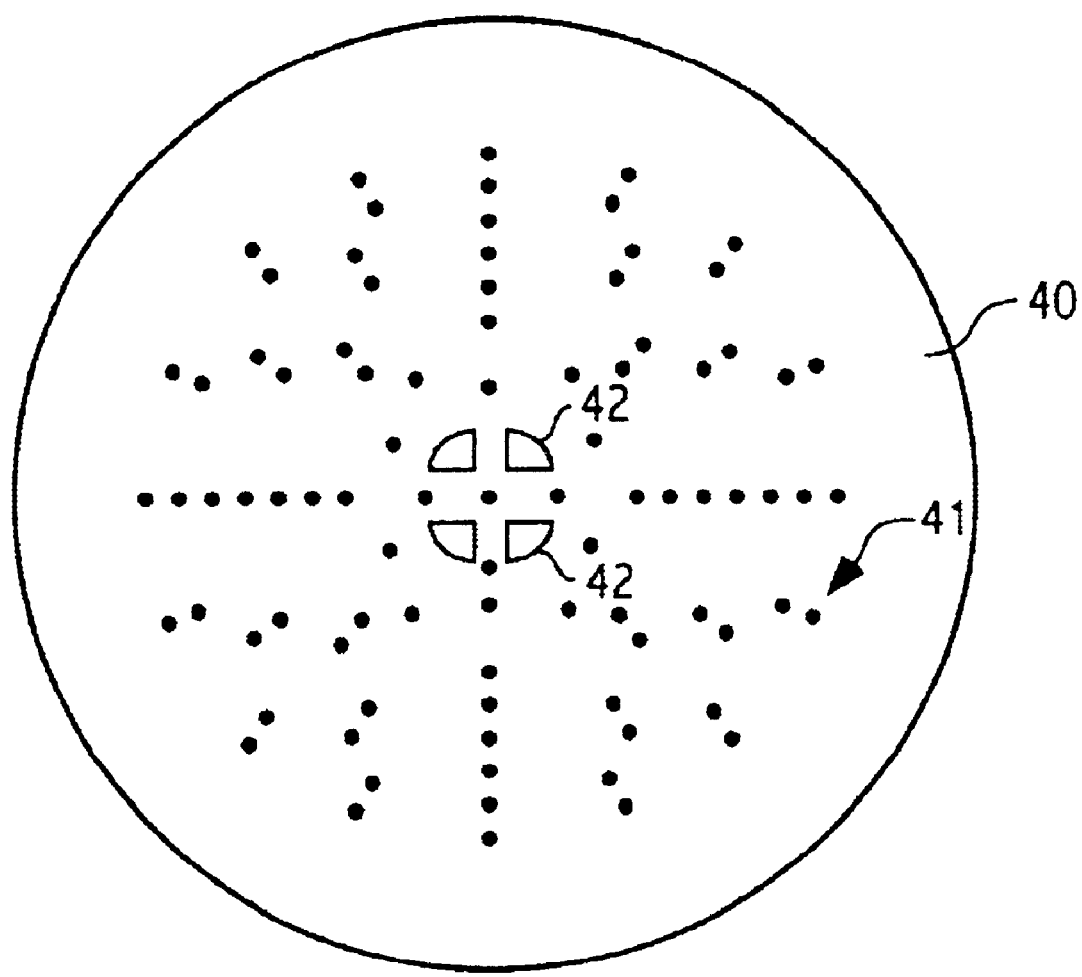
FIG. 4 is a top view of a gas distribution plate for the etch chamber of FIG. 3 according to one embodiment of the present invention.

The gas distribution plate can have various designs one example of which is shown in FIG. 4. The gas distribution plate 40 shown in FIG. 4 includes eighty-nine holes 41 and four embossments 42 near the center thereof for providing a passage for supply of process gas between the gas distribution plate and the dielectric window.

As shown in FIG. 3, the plasma exposed surfaces of the gas distribution plate 22, chamber liner 30, and/or focus ring 14 are provided with plasma sprayed coatings 32 of ceramic or polymeric materials having surface roughness characteristics that promote polymer adhesion. In this manner, particulate contamination inside the reactor can be substantially reduced.

After time in use, the interior surfaces of the reactor components according to the present invention can become coated with polymer deposits. According to another embodiment of the present invention, the component can be removed from the reactor so that the existing plasma sprayed coating and any accumulated deposits can be physically removed from the component and a new plasma sprayed coating applied. The old coating can be removed using mechanical means such as grinding or grit blasting. In this manner, the reactor components can be reused.

A tape test was performed to determine the adhesion properties of the plasma sprayed coatings of the present invention. An alumina gas distribution plate with a plasma sprayed coating of alumina according to the present invention was installed and used in a TCP 9600™ metal etch reactor. A standard hot-pressed and sintered alumina gas distribution plate (without the plasma sprayed coating) was used in the same type of reactor under similar conditions. Substantial polymer deposits formed on the plasma exposed surfaces of both gas distribution plates. In the tape test, a piece of tape was adhered to the surface of each gas distribution plate and peeled off. No polymer was visible on the piece of tape removed from the plasma sprayed GDP. A visual inspection of the tape removed from the standard (non-plasma sprayed) GDP, however, revealed substantial polymer deposits thereon.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A component of a plasma etch reactor, the component being selected from the group consisting of a plasma confinement ring, a focus ring, a pedestal, a chamber wall, a chamber liner and a gas distribution plate, the component having one or more surfaces exposed to the plasma during processing, the component comprising an as-sprayed plasma sprayed coating on a plasma exposed surface of the component, the coating being a ceramic material selected from the group consisting of, yttria, zirconia, silicon carbide, silicon nitride, boron carbide and boron nitride, and the coating having an as-sprayed surface roughness that promotes the adhesion of polymer deposits formed during etching of semiconductor substrates in the plasma etch reactor.

2. The component of claim 1, wherein the component is made from a metallic material or a ceramic material.

3. The component of claim 1, wherein the coating is of yttria.

4. The component of claim 1, wherein the coating has an arithmetic mean surface roughness value (Ra) of from 150 to 190 micro-inches.

5. A plasma etch reactor comprising at least one component according to claim 1.

6. A method of processing a semiconductor substrate in the plasma etch reactor of claim 5, the method comprising contacting an exposed surface of a semiconductor substrate with a plasma.

7. The method of claim 6, further comprising steps of:
positioning the substrate on a substrate support in the reactor;
introducing a process gas into the reactor;
applying RF energy to the process gas to generate a plasma adjacent an exposed surface of the substrate; and
etching the exposed substrate surface with a plasma.

8. The method of claim 6, wherein the exposed surface of the substrate comprises a metallic material or an oxide.

9. The method of claim 7, wherein the process gas comprises at least one polymer forming species.

10. The method of claim 7, wherein the component is a gas distribution plate, the method further comprising introducing the process gas into the reactor through openings in the gas distribution plate.

11. The component of claim 1, wherein the component comprises a ceramic material.

12. A component of a plasma etch reactor, the component comprising aluminum having an anodized or non-anodized plasma exposed surface, the component comprising an as-sprayed plasma sprayed coating on a plasma exposed surface of the component, the coating being a ceramic material selected from the group consisting of, yttria, zirconia, silicon carbide, silicon nitride, boron carbide and boron nitride, and the coating having an as-sprayed surface roughness that promotes the adhesion of polymer deposits formed during etching of semiconductor substrates in the plasma etch reactor.

13. The component of claim 12, wherein the coating is of yttria.

14. The component of claim 13, wherein the coating has a thickness of 2 to 5 mils.

15. A component of a plasma etch reactor, the component being made from a ceramic material selected from the group consisting of alumina, yttria, zirconia, silicon carbide, silicon nitride, boron carbide and boron nitride, the component having one or more surfaces exposed to the plasma during processing, the component comprising an as-sprayed plasma sprayed coating on a plasma exposed surface of the component, the coating being a ceramic material selected from the group consisting of, yttria, zirconia, silicon carbide, silicon nitride, boron carbide and boron nitride, and the coating having an as-sprayed surface roughness that promotes the adhesion of polymer deposits formed during etching of semiconductor substrates in the plasma etch reactor.

16. The component of claim 15, wherein the coating is.

17. A component of a plasma etch reactor, the component having one or more surfaces exposed to the plasma during processing, the component comprising an as-sprayed plasma sprayed coating on a plasma exposed surface of the component, the component and the coating both comprising the same ceramic material selected from the group consisting of yttria, zirconia, silicon carbide, silicon nitride, boron carbide and boron nitride, and the coating having an as-sprayed surface roughness that promotes the adhesion of polymer deposits formed during etching of semiconductor substrates in the plasma etch reactor.

18. A component of a plasma reactor, the component having one or more surfaces exposed to the plasma during processing, the component comprising an as-sprayed plasma sprayed polyimide coating on a plasma exposed surface of the component, wherein the coating has an as-sprayed surface roughness that promotes the adhesion of polymer deposits.

19. The component of claim 18, wherein the coating has a thickness of 10 to 30 mils.

20. A component of a plasma etch reactor, the component having one or more surfaces exposed to the plasma during processing, the component comprising a coating formed by a process consisting essentially of plasma spraying a coating material on a plasma exposed surface of the component that has not been roughened, the coating being a ceramic material comprising at least one material selected from the group consisting of yttria, zirconia, silicon carbide and boron carbide, the coating having an as-sprayed surface roughness that promotes the adhesion of polymer deposits formed during etching of semiconductor substrates in the plasma etch reactor.

21. The component of claim 20, wherein the coating has an surface roughness value (Ra) of between 150 and 190 micro-inches.

* * * * *

UNITED STATES PATENT AND TRADEMARK OFFICE
CERTIFICATE OF CORRECTION

PATENT NO. : 6,805,952 B2
DATED : October 19, 2004
INVENTOR(S) : Christopher C. Chang et al.

It is certified that error appears in the above-identified patent and that said Letters Patent is hereby corrected as shown below:

Column 10,
Line 16, "16. The component of claim 15, wherein the coating is." should read as follows:
-- 16. A component of a plasma etch reactor, the component comprising aluminum having an anodized or non-anodized plasma exposed surface, the component comprising an as-sprayed plasma sprayed coating on a plasma exposed surface of the component, the coating being a ceramic material selected from the group consisting of alumina, yttria, zirconia, silicon carbide, silicon nitride, boron carbide and boron nitride, and the coating having an as-sprayed surface roughness that promotes the adhesion of polymer deposits formed during etching of semiconductor substrates in the plasma etch reactor. --

Signed and Sealed this

Eighth Day of February, 2005

JON W. DUDAS
*Director of the United States Patent and Trademark Office*